US010186309B2

(12) United States Patent
Oh et al.

(10) Patent No.: US 10,186,309 B2
(45) Date of Patent: Jan. 22, 2019

(54) METHODS OF OPERATING SEMICONDUCTOR MEMORY DEVICES AND SEMICONDUCTOR MEMORY DEVICES

(71) Applicant: Samsung Electronics Co., Ltd., Suwon-si (KR)

(72) Inventors: Ki-Seok Oh, Seoul (KR); Seong-Hwan Jeon, Hwaseong-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 15/624,491

(22) Filed: Jun. 15, 2017

(65) Prior Publication Data
US 2018/0005686 A1 Jan. 4, 2018

(30) Foreign Application Priority Data

Jun. 29, 2016 (KR) .................. 10-2016-0081276
Aug. 8, 2016 (KR) .................. 10-2016-0100453

(51) Int. Cl.
*G11C 8/00* (2006.01)
*G11C 11/4076* (2006.01)
*G11C 11/4093* (2006.01)
*G11C 11/4096* (2006.01)
*G11C 29/52* (2006.01)
*G11C 7/10* (2006.01)
*G06F 11/10* (2006.01)
(Continued)

(52) U.S. Cl.
CPC ........ *G11C 11/4076* (2013.01); *G11C 7/1066* (2013.01); *G11C 7/1093* (2013.01); *G11C 11/4093* (2013.01); *G11C 11/4096* (2013.01); *G11C 29/52* (2013.01); *G06F 11/1004* (2013.01); *G11C 29/023* (2013.01); *G11C 29/028* (2013.01); *G11C 2029/0411* (2013.01)

(58) Field of Classification Search
CPC .................................................. G11C 11/4076
USPC ....................................................... 365/233.1
See application file for complete search history.

(56) References Cited

U.S. PATENT DOCUMENTS 6,215,710 B1 4/2001 Han et al.
7,269,699 B2 9/2007 Jang
(Continued)

FOREIGN PATENT DOCUMENTS

KR 2000-0027381 A 5/2000
KR 2009-0026276 A 3/2009
(Continued)

*Primary Examiner* — Hoai V Ho
(74) *Attorney, Agent, or Firm* — Muir Patent Law, PLLC

(57) ABSTRACT

In a method of operating a semiconductor memory device including a memory cell array and a control logic circuit configured to control access to the memory cell array, data synchronized with a differential data clock signal is received from an external memory controller, the data is stored in the memory cell array based on a frequency-divided data clock signal from which the differential data clock signal is divided, data is read from the memory cell array in response to a read command and a target address from the memory controller, and the read data is transmitted to the memory controller with one of a single strobe signal and a differential strobe signal according to a strobe mode of the semiconductor memory device.

15 Claims, 14 Drawing Sheets

(51) Int. Cl.
  *G11C 29/02* (2006.01)
  *G11C 29/04* (2006.01)

(56) References Cited

U.S. PATENT DOCUMENTS

| | | |
|---|---|---|
| 7,990,777 B2 | 8/2011 | Rha |
| 8,019,907 B2 | 9/2011 | Talbot |
| 8,086,813 B2 | 12/2011 | Gillingham et al. |
| 8,284,621 B2 | 10/2012 | Dreps et al. |
| 8,347,198 B2 | 1/2013 | Shin et al. |
| 8,423,700 B2 | 4/2013 | Panabaker et al. |
| 8,713,231 B2 | 4/2014 | Nishioka et al. |
| 9,300,282 B2 | 3/2016 | Kim et al. |
| 2014/0043925 A1* | 2/2014 | Lin .................. G11C 7/1045 365/193 |
| 2014/0140145 A1 | 5/2014 | Taruishi et al. |

FOREIGN PATENT DOCUMENTS

| | | |
|---|---|---|
| KR | 2009-0035508 A | 4/2009 |
| KR | 2009-0059838 A | 6/2009 |

\* cited by examiner

METHODS OF OPERATING SEMICONDUCTOR MEMORY DEVICES AND SEMICONDUCTOR MEMORY DEVICES

CROSS-REFERENCE TO RELATED APPLICATION(S)

This application claims priority under 35 U.S.C. § 119 to Korean Patent Application No. 10-2016-0081276, filed on Jun. 29, 2016 and Korean Patent Application No. 10-2016-0100453, filed on Aug. 8, 2016 in the Korean Intellectual Property Office, the contents of which are incorporated by reference herein in their entirety.

BACKGROUND

1. Technical Field

Exemplary embodiments relate to memory devices, and more particularly to methods of operating semiconductor memory devices and semiconductor memory devices.

2. Discussion of the Related Art

A volatile semiconductor memory device such as a dynamic random access memory (DRAM) may be used as a data memory of an electronic system.

For example, a DRAM implemented according to the Graphics Double Data Rate version 5 (GDDR5) standard may be mounted on a graphic card of an electronic system. The GDDR5 DRAM may have error detection code (EDC) pins for outputting an EDC pattern to support error detection and correction functions.

In a data access mode where data is read or data is written, a Cyclic Redundancy Check (CRC) code pattern may be output from the EDC pins to secure the reliability of data transmitted and received.

In an operation mode (e.g., a clocking mode) other than the data access mode, a detection clock pattern such as an EDC hold pattern may be output from the EDC pins to provide a Clock Data Recovery (CDR) function to a memory controller, a Graphics Processing Unit (GPU) or a Central Processing Unit (CPU).

A semiconductor memory device, such as GDDR5 DRAM having no data strobe (DQS) circuit and no dedicated strobe pin may be typically needed to enhance a jitter characteristic of read data.

SUMMARY

Some exemplary embodiments provide method of operating a semiconductor memory device, capable of supporting a data strobe mode when the semiconductor memory device operates based on a data clock signal.

Some exemplary embodiments provide a semiconductor memory device, capable of supporting a data strobe mode when the semiconductor memory device operates based on a data clock signal.

According to exemplary embodiments, a method of operating a semiconductor memory device including a plurality of pins configured to transfer data and signals from/to an outside of the semiconductor memory device, a memory cell array and a control logic circuit configured to control access to the memory cell array is provided. Data synchronized with a differential data clock signal is received from an external memory controller, the data is stored in the memory cell array based on a frequency-divided data clock signal from which the differential data clock signal is divided, data is read from the memory cell array in response to a read command and a target address from the memory controller, and the read data is transmitted to the memory controller with a selected one of a first strobe signal generated based on the frequency-divided data clock signal and a differential strobe signal generated based on the frequency-divided data clock signal. The differential strobe signal includes the first strobe signal and a second strobe signal which is the first strobe signal inverted. The semiconductor memory device does not include a dedicated strobe pin among the plurality of pins.

According to exemplary embodiments, a semiconductor memory device includes a plurality of pads disposed on a substrate, a memory cell array, a control logic circuit and an input/output (I/O) circuit. The memory cell array stores data which is synchronized with a differential data clock signal received from an external memory controller in a write operation of the semiconductor memory device. The control logic circuit may control access on the memory cell array in response to a command and address received from the memory controller. The I/O circuit transmits read data from the memory cell array to the memory controller with a selected one of a first strobe signal generated based on a frequency-divided data clock signal from which the differential data clock signal is divided and a differential strobe signal generated based on the frequency-divided data clock signal.

According to exemplary embodiments, a method of operating a semiconductor memory device including a memory cell array and a plurality of chip pads on a substrate is provided. The method includes transmitting data from the memory cell array to an outside of the semiconductor memory device through a data pad of the chip pads in a first mode of the semiconductor memory device, transmitting a data strobe (RDQS) signal to the outside of the semiconductor memory device through a first pad of the chip pads in a second mode of the semiconductor memory device, transmitting the RDQS signal and an inverted data strobe (RDQSB) signal to the outside of the semiconductor memory device through the first pad and a second pad of the chip pads, respectively, in a third mode of the semiconductor memory device. The semiconductor memory device does not include a dedicated data strobe pad among the plurality of pads.

Accordingly, a semiconductor memory device and a memory system using WCK clocking support a read data strobe mode in which a single strobe signal or a differential strobe signal is used, and jitter characteristic of the semiconductor memory device may be enhanced.

BRIEF DESCRIPTION OF THE DRAWINGS

Illustrative, non-limiting exemplary embodiments will be more clearly understood from the following detailed description taken in conjunction with the accompanying drawings.

DETAILED DESCRIPTION OF THE EMBODIMENTS

Various exemplary embodiments will be described more fully hereinafter with reference to the accompanying drawings, in which some exemplary embodiments are shown.

It will be understood that, although the terms first, second, third etc. may be used herein to describe various elements, these elements should not be limited by these terms. Unless indicated otherwise, these terms are generally used to distinguish one element from another. Thus, a first element discussed below in one section of the specification could be termed a second element in a different section of the specification without departing from the teachings of the present disclosure. Also, terms such as "first" and "second" may be used in the claims to name an element of the claim, even thought that particular name is not used to describe in connection with the element in the specification. As used herein, the term "and/or" includes any and all combinations of one or more of the associated listed items. Expressions such as that, although the terms first, second, third etc. may be used herein to describe various elements, these elements should elements of the list.

Figure 1:
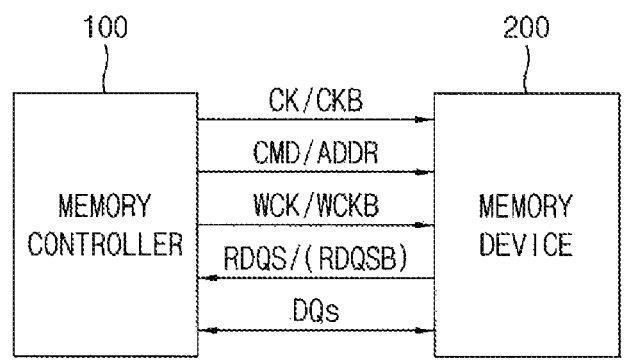
FIG. 1 is a block diagram illustrating a memory system according to exemplary embodiments.

FIG. 1 is a block diagram illustrating a memory system according to exemplary embodiments.

Referring to FIG. 1 a memory system 10 may include a memory controller 100 and a semiconductor memory device 200.

The memory controller 100 may control overall operation of the semiconductor memory device 200.

The memory controller 100 transmits command/address CMD/ADDR to the semiconductor memory device 200 in synchronization with a differential clock signal CK/CKB including a clock signal CK and a complementary (or, inverted) clock signal CKB. The memory controller 100 transmits data DQs to the semiconductor memory device 200 in synchronization with a differential data clock signal WCK/WCKB including a data clock signal WCK and a complementary (or, inverted) data clock signal WCKB.

The semiconductor memory device 200 transmits the data DQs to the memory controller 100 in an access mode (e.g., a read mode or a write mode). The semiconductor memory device 200 transmits the data DQs to the memory controller 100 without a strobe signal (referred to as a data strobe signal) in a non-strobe mode (or, the access mode) and transmits the data DQs to the memory controller 100 in synchronization with one of a single strobe signal RDQS (referred to as a single ended data strobe signal) and a differential strobe signal RDQS/RDQSB (referred to as a differential data strobe signal) having the RDQS signal and a complementary (or, inverted) strobe signal RDQSB in a strobe mode.

Each of the memory controller 100 and the semiconductor memory device 200 may include a plurality of signal chip pads on a substrate (not shown). The signal chip pads are connected to internal circuitry (e.g., appropriate I/O buffers, internal clock generators, latches, etc.) of a chip to send and/or receive information or timing control (such as data, address and control information and clock signals) with respect to an external source (e.g., another chip or device).

When each of the memory controller 100 and the semiconductor memory device 200 is formed in a package, a plurality of pins of the memory controller 100 and a plurality of pins of the semiconductor memory device 200 are connected with each other. The plurality of signal chip pads of the memory controller 100 are connected with the plurality of pins of the memory controller 100. The plurality of signal chip pads of the semiconductor memory device 200 are connected with the plurality of pins of the semiconductor memory device 200.

The semiconductor memory device 200, such as GDDR5 DRAM may not have a dedicated a strobe pad or pin and a data strobe (DQS) circuit in the semiconductor memory device 200. A pin for transferring signals to/from the outside of the semiconductor memory device such as 200 may be referred to as an external connection terminal. In example embodiments, the semiconductor memory device 200 may transfer the single strobe signal RDQS and the differential strobe signal RDQS/RDQSB by using particular pins or pads among the plurality of pins or pads of the semiconductor memory device 200.

In some embodiments, the semiconductor memory device 200 may be a dynamic random access memory (DRAM), such as a double data rate synchronous dynamic random access memory (DDR SDRAM), LPDDR5 SDRAM, etc.

The memory controller 100 may designate one of the access mode and the strobe mode of the semiconductor memory device 200 using the command CMD and the address ADDR.

Figure 2:
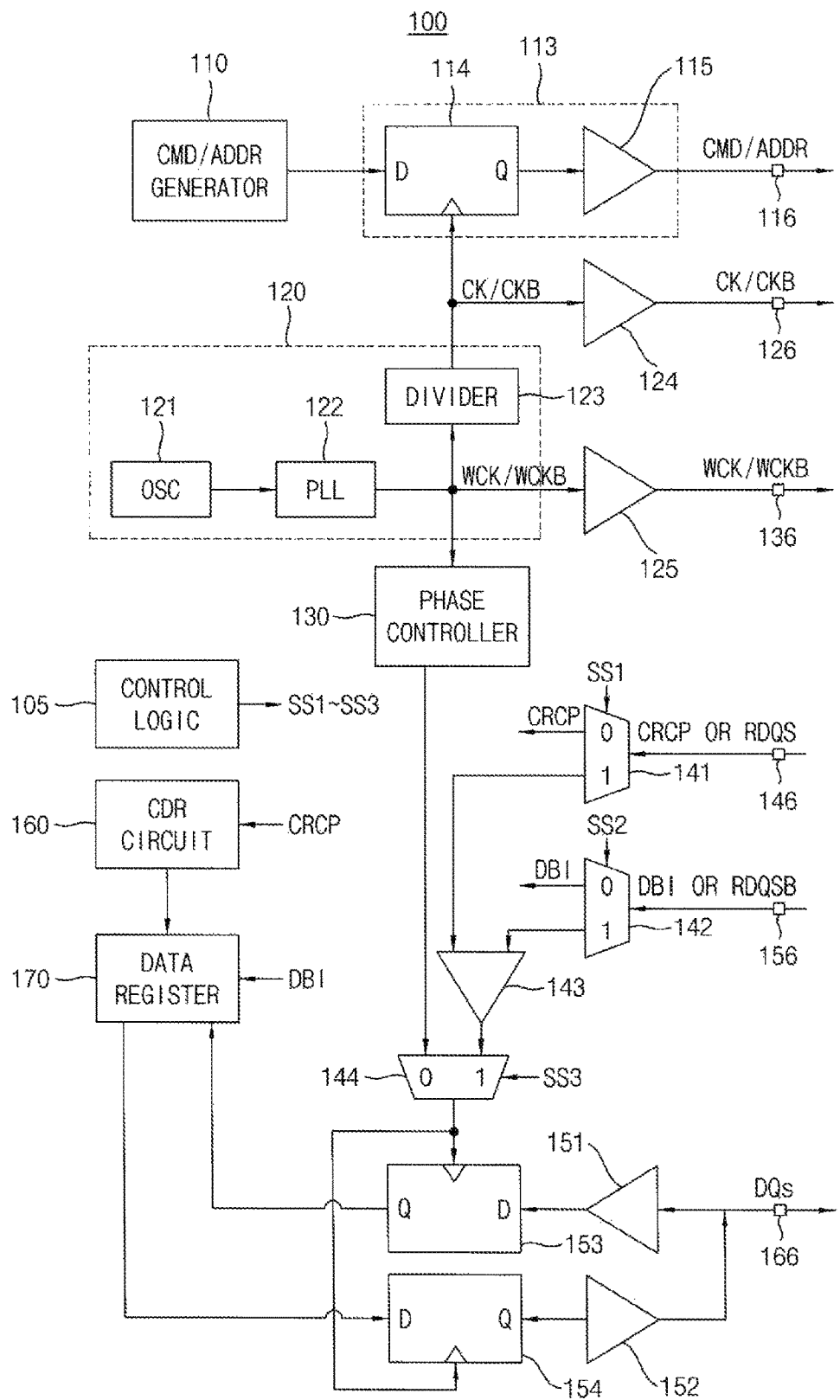
FIG. 2 is a block diagram illustrating the memory controller in the memory system of FIG. 1 according to exemplary embodiments.

FIG. 2 is a block diagram illustrating the memory controller in the memory system of FIG. 1 according to exemplary embodiments.

Referring to FIG. 2, the memory controller 100 may include a control logic 105, a command/address generator 110, a command/address transmission circuit 113, a clock signal generator 120, a clock signal transmitter 124, a data clock signal transmitter 125, a phase controller 130, a first demultiplexer 141, a second demultiplexer 142, a driver 143, a multiplexer 144, a data receiver 151, a data transmitter 152, a first sampler 153, a second sampler 154, a clock/data recovery (CDR) circuit 160 and a data register 170.

The command/address generator 110 generates the command CMD and the address ADDR and provides the command CMD and the address ADDR to the command/address transmission circuit 113. The command/address transmission circuit 113 includes a sampler 114 and a transmitter 115. The sampler 114 provides the command CMD and the address ADDR to the sampler 114 in synchronization with the clock signal CK and the transmitter 115 transmits the command CMD and the address ADDR to the semiconductor memory device 200 through a pad 116.

The clock signal generator 120 includes an oscillator 121, a phase-locked loop (PLL) circuit 122 and a divider 123. The oscillator 121 generates oscillation signal OS to provides the oscillation signal OS to the PLL circuit 122. The PLL circuit 122 generates the differential data clock signal WCK/WCKB in response to the oscillation signal OS and provides the differential data clock signal WCK/WCKB to the divider 123, the data clock signal transmitter 125 and the phase controller 130.

The data clock signal transmitter 125 transmits the differential data clock signal WCK/WCKB to the semiconductor memory device 200 through a pad 136. The divider 123 divides a frequency of the differential data clock signal WCK/WCKB to generate the differential clock signal CK/CKB. The divider 123 provides the differential clock signal CK/CKB to the clock signal transmitter 124 and the clock signal transmitter 124 transmits the differential clock signal CK/CKB to the semiconductor memory device 200 through a pad 126.

In one example, a frequency of the differential data clock signal WCK/WCKB may be two times or four times higher than a frequency of the differential clock signal CK/CKB.

The phase controller 130 adjusts a phase of the differential data clock signal WCK/WCKB to provide the phase-adjusted differential data clock signal to the multiplexer 144.

The first demultiplexer 141 receives a cyclic redundancy check (CRC) pattern CRCP (or, an error detection code pattern EDCP) from the semiconductor memory device 200 through a pad 146 in the access mode, and receives a strobe signal RDQS from the semiconductor memory device 200 in a first strobe mode (i.e., a single strobe mode). The first demultiplexer 141 provides the CRC pattern CRCP to the CDR circuit 160 in the access mode and provides the strobe signal RDQS to the driver 143 in the first strobe mode, in response to a first selection signal SS1.

The second demultiplexer 142 receives a data inversion bit signal DBI from the semiconductor memory device 200 through a pad 156 in the access mode, and receives a complementary strobe signal RDQSB from the semiconductor memory device 200 in a second strobe mode (a differential strobe mode). The second demultiplexer 142 provides the data inversion bit signal DBI to the data register 170 in the access mode and provides the complementary strobe signal RDQSB to the driver 143 in the second strobe mode, in response to a second selection signal SS2.

The multiplexer 144 provides the phase-adjusted differential data clock signal, from the phase controller 130, to the samplers 153 and 154 in the access mode and provides the strobe signal RDQS or the complementary strobe signal RDQSB to the samplers 153 and 154 in the access mode, in the strobe mode.

The first sampler 153 provides the data DQs from the data receiver 151 to the data register 170 in synchronization with the phase-adjusted differential data clock signal in the access mode and provides the data DQs from the data receiver 151 to the data register 170 in synchronization with the strobe signal RDQS or the complementary strobe signal RDQSB in the strobe mode. The data receiver 151 receives data DQs from the semiconductor memory device 200 through a pad 166 (e.g., data I/O pad, or DQ pad).

The second sampler 154 transmits the data DQS from the data register 170 to the semiconductor memory device 200 through the data transmitter 152 in synchronization with the phase-adjusted differential data clock signal in the access mode and transmits the data DQS from the data register 170 to the semiconductor memory device 200 through the data transmitter 152 in synchronization with the strobe signal RDQS or the complementary strobe signal RDQSB in the strobe mode. The data transmitter 152 transmits data DQs to the semiconductor memory device 200 through the DQ pad 166.

Each of the first sampler 153 and the second sampler 154 may include a D flip-flop.

The data register 170 provides the data stored therein to the second sampler 154 in a write operation of the semiconductor memory device 200. The data register 170 receives the data from the first sampler 153 in a read operation of the semiconductor memory device 200, selectively inverts the data in response to the data inversion bit signal DBI and stores the data therein.

The CDR circuit 160 may perform a CDR operation on the data stored in the data register 170 using the CRC pattern CRCP. For example, the CDR operation may be performed in a CDR function mode.

The control logic 105 may control overall operation of the memory controller 100. The control logic 105 may control each operation of the command/address generator 110, the command/address transmission circuit 113, the clock signal generator 120, the clock signal transmitter 124, the data clock signal transmitter 125, the phase controller 130, the first demultiplexer 141, the second demultiplexer 142, the driver 143, the multiplexer 144, the data receiver 151, the data transmitter 152, the first sampler 153, the second sampler 154, the CDR circuit 160 and the data register 170. The control logic 105 may provide the first selection signal SS1 to the first demultiplexer 141, provide the second selection signal SS2 to the second demultiplexer 142 and provide the third selection signal SS3 to the multiplexer 144.

Figure 3:
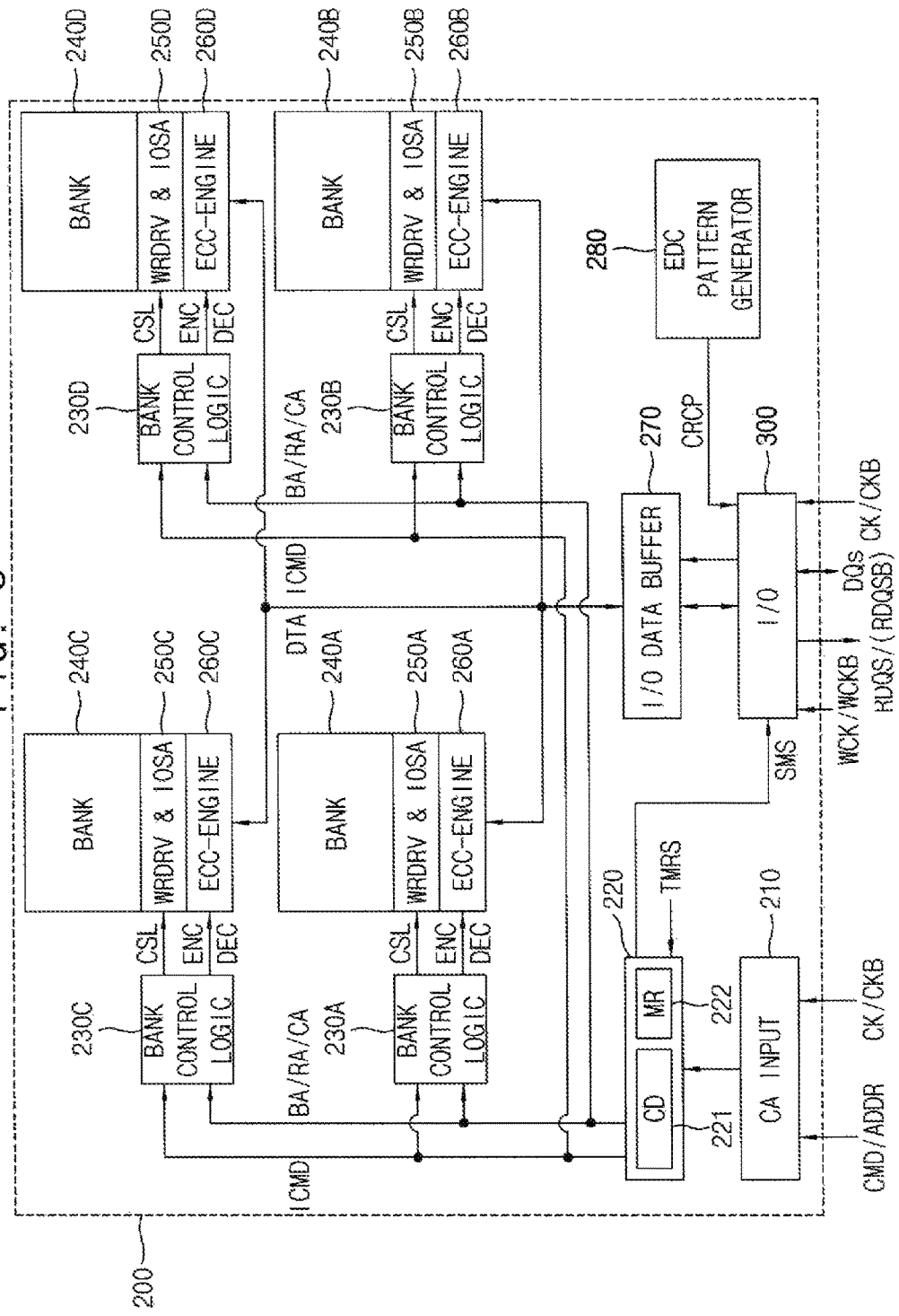
FIG. 3 is a block diagram illustrating the semiconductor memory device in the memory system of FIG. 2 according to exemplary embodiments.

FIG. 3 is a block diagram illustrating the semiconductor memory device in the memory system of FIG. 2 according to exemplary embodiments.

Referring to FIG. 3, the semiconductor memory device 200 may include a command/address input buffer 210, a control logic circuit 220, bank control logics 230A~230D, memory cell arrays 240A~240D, write driver and data input/output (I/O) sense amplifiers 250A~250D, error correction code (ECC) engines 260A~260D, an I/O data buffer 270, an EDC pattern generator 280 and an I/O circuit 300.

The memory cell arrays 240A~240D may include first through fourth bank arrays 240A~240D, respectively, in which a plurality of memory cells are arranged in rows and columns. A row decoder and a column decoder for selecting word-lines and bit-lines that are connected to the memory cells may be connected to each of the first through fourth bank arrays 240A~240D. In the exemplary embodiment, the semiconductor memory device 200 includes the four banks, but in other embodiments, the semiconductor memory device 200 may include an arbitrary number of banks.

The command/address input buffer 210 may receive the differential clock signal CK/CKB, a command CMD, and the address ADDR from the memory controller 100. The command CMD and the address ADDR may be input via the same terminals, i.e., CA pads. The command CMD and the address ADDR may be sequentially input via the CA pads. The command CMD issued by the memory controller 100 may include a read command and a write command. The read command indicates a read operation of the semiconductor memory device 200, and the write command indicates a write operation of the semiconductor memory device 200.

The control logic circuit 220 may receive the command CMD and the address ADDR via the command/address input buffer 210, and may generate an internal command ICMD, a strobe mode signal SMS and an address signal. The internal command ICMD may include an internal read command and an internal write command. The address signal may include a bank address BA, a row address RA, and a column address CA. The internal command ICMD and the address signal BA/RA/CA may be provided to each of the bank control logics 230A~230D. The control logic circuit 220 may control access to the memory cell arrays 240A~240D.

The control logic circuit 220 may include a command decoder 221 and a mode register 222. The command decoder 221 decodes the command CMD to generate the internal command ICMD and the mode register 222 may set an operation mode of the semiconductor memory device 200 based on the command CMD and the address ADDR. The mode register 222 may set the access mode or the strobe mode of the semiconductor memory device 200 based on the command CMD and the address ADDR or a test mode register set signal TMRS, which is externally applied. The mode register 222 may provide the I/O circuit 300 with a strobe mode signal SMS indicating one of the CDR function mode, the access mode, and the strobe mode. In example embodiments, the command decoder 221 decodes a command CMD received from the memory controller 100 to generate the strobe mode signal SMS indicating one of the CDR function mode, the access mode, and the strobe mode.

Each of the bank control logics 230A~230D may be activated while corresponding to the bank address BA. The activated bank control logics 230A~230D may generate bank control signals in response to the internal command ICMD, the row address RA, and the column address CA. In response to the bank control signal, the row decoder and the column decoder of each of the first through fourth bank arrays 240A~240D that are connected to the activated bank control logics 230A~230D may be activated.

The row decoder of each of the first through fourth bank arrays 240A~240D may decode the row address RA and therefore may enable a word-line that corresponds to the row address RA. The column address CA of each of the first through fourth bank arrays 240A~240D may be temporarily stored in a column address latch. The column address latch may stepwise increase the column address CA in a burst mode. The temporarily stored or stepwise increased column address CA may be provided to the column decoder. The column decoder may decode the column address CA and therefore may activate a column selection signal CSL that corresponds to the column address CA.

In response to the bank control signal, each of the bank control logics 230A~230D may generate an ECC encoding signal ENC and an ECC decoding signal DEC for controlling operations of the ECC engines 260A~260D that are connected to the first through fourth bank arrays 240A~240D, respectively.

The write driver and data I/O sense amplifiers 250A~250D may sense and amplify a plurality of pieces of read data output from the first through fourth bank arrays 240A~240D, respectively, and may transmit a plurality of pieces of write data DTA to be stored in the first through fourth bank arrays 240A~240D, respectively.

During the write operation, each of the ECC engines 260A~260D may generate parity bits by performing an ECC encoding operation on the plurality of pieces of write data to be stored in each of the first through fourth bank arrays 240A~240D, in response to the ECC encoding signal ENC output from each of the bank control logics 230A~230D.

During the read operation, each of the ECC engines 260A~260D may perform an ECC decoding operation by using the plurality of pieces of data DTA and parity bits that are read from each of the first through fourth bank arrays 240A~240D, in response to the ECC decoding signal DEC output from each of the first through fourth bank arrays 240A~240D, and therefore may detect and correct an error bit occurred in the plurality of pieces of read data.

The I/O data buffer 270 may include circuits for gating a plurality of pieces of data that are input to or output from the first through fourth bank arrays 240A~240D, read data latch circuits for storing the plurality of pieces of data output from the first through fourth bank arrays 240A~240D, and write data latch circuits for writing the plurality of pieces of data to the first through fourth bank arrays 240A~240D.

The I/O data buffer 270 may convert parallel data bits that are output from the first through fourth bank arrays 240A~240D into serial data bits via the read data latches. The I/O data buffer 270 may convert a plurality of pieces of write data that are serially received into parallel data bits by using the write data latches.

The EDC pattern generator 280 may generate the CRC pattern CRCP in the access mode.

The I/O circuit 300 may receive the serial data bits output from the I/O data buffer 270, may sequentially array the serial data bits as data bits that correspond to a burst length, and then may output together the data bits and the strobe signal RDQS or the differential strobe signal RDQS/RDQSB to data I/O pads. The I/O circuit 300 may receive the differential data clock signal WCK/WCKB and the plurality of pieces of write data that correspond to the burst length and that are serially input via the data I/O pads from the memory controller 100. The I/O circuit 300 may provide, to the I/O data buffer 270, the plurality of pieces of serially input write data that correspond to the burst length.

The I/O circuit 300 may receive the differential clock signal CK/CKB.

Figure 4:
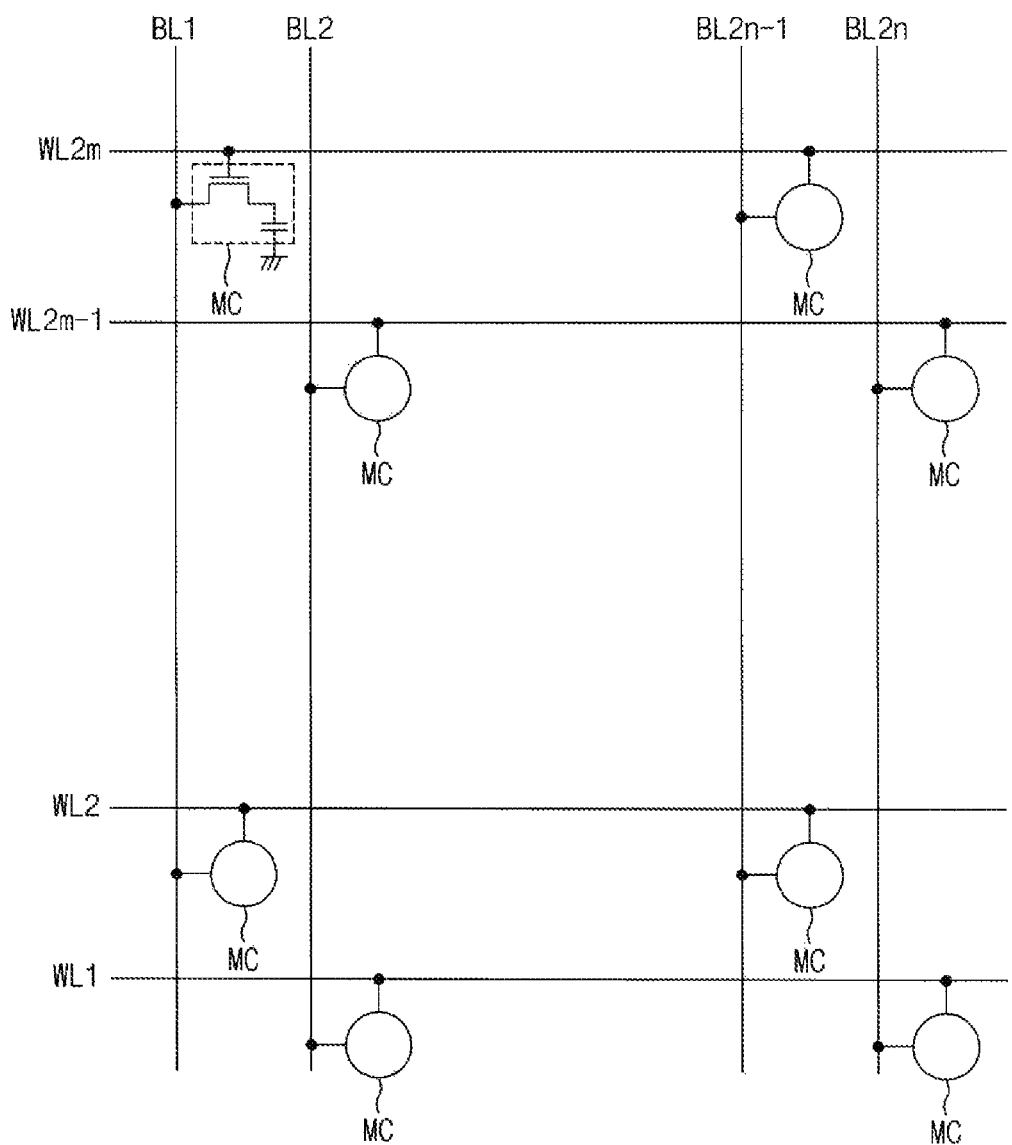
FIG. 4 illustrates an example of the first bank array in the semiconductor memory device of FIG. 3.

FIG. 4 illustrates an example of the first bank array in the semiconductor memory device of FIG. 3.

Referring to FIG. 4, the first bank array 240A includes a plurality of word-lines WL1~WL2m (m is a natural number greater than one), a plurality of bit-lines BL1~BL2n (n is a natural number greater than one), and a plurality of memory cells MCs disposed near intersections between the word-lines WL1~WL2m and the bit-lines BL1~BL2n. In one embodiment, each of the plurality of memory cells MCs may include a dynamic random access memory (DRAM) cell structure. The plurality of word-lines WL1~WL2m to which the plurality of memory cells MCs are connected may be defined as rows of the first bank array 240A and the plurality of bit-lines BL1~BL2n to which the plurality of memory cells MCs are connected may be defined as columns of the first bank array 240A.

In FIG. 4, m memory cells are coupled to a bit-line BL of the first bank array 310 and n memory cells are coupled to a word-line of the first bank array 310.

Figure 5:
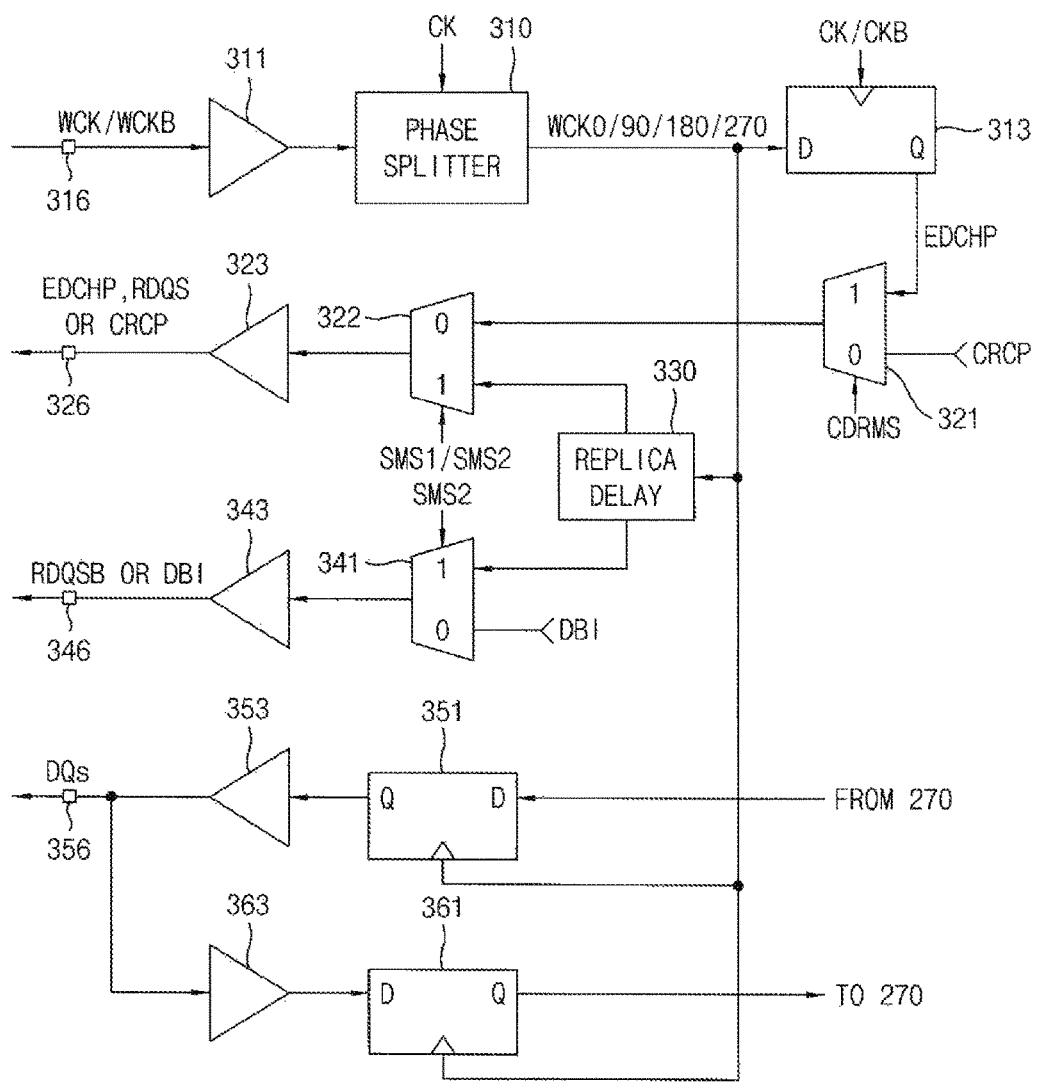
FIG. 5 illustrates an example of the I/O circuit in the semiconductor memory device of FIG. 3 according to exemplary embodiments.

FIG. 5 illustrates an example of the I/O circuit in the semiconductor memory device of FIG. 3 according to exemplary embodiments.

Referring to FIG. 5, the I/O circuit 300 may include a data clock signal receiver 311, a phase splitter 310, a D flip-flop 313, a first multiplexer 321, a second multiplexer 322, a first transmitter 323, a replica delay 330, a third multiplexer 341, a second transmitter 343, a first sampler 351, a data transmitter 353, a second sampler 361 and a data receiver 363.

The data clock signal receiver 311 receives the differential data clock signal WCK/WCKB from the memory controller 100 through a pad 316 to provide the differential data clock signal WCK/WCKB to the phase splitter 310.

The phase splitter 310 divides a phase and a frequency of the differential data clock signal WCK/WCKB, generates frequency-divided data clock signals WCK0, WCK90, WCK180, and WCK270 and matches a phase of the first frequency-divided data clock signals WCK0 to a phase of the clock signal CK. The phase splitter 310 provides the frequency-divided data clock signals WCK0, WCK90, WCK180, and WCK270 to the replica delay 330, the first sampler 351 and the second sampler 361. Each frequency of the frequency-divided data clock signals WCK0, WCK90, WCK180, and WCK270 may be a half of the frequency of the differential data clock signal WCK/WCKB.

The D flip-flop 313 may output at least one of the frequency-divided data clock signals WCK0, WCK90, WCK180, and WCK270 as an EDC hold pattern EDCHP in synchronization with the differential clock signal CK/CKB.

The first multiplexer 321 outputs the CRC pattern CRCP in the access mode and outputs the EDC hold pattern EDCHP, for example, in the CDR function mode in response to a Clock Data Recovery mode signal (CDRMS). In example embodiments, the EDC hold pattern EDCHP may be stored in a register (not illustrated) and then may be provided to the first multiplexer 321. The EDC hold pattern EDCHP may be a toggling data pattern in which logic '0' and logic '1' are alternatingly repeated. A frequency of the EDC hold pattern EDCHP, which is provided in the CDR function mode, may be same as a frequency of the differential clock signal CK/CKB, two times higher than the frequency of the differential clock signal CK/CKB, or four times higher than the frequency of the differential clock signal CK/CKB.

A frequency of the EDC hold pattern EDCHP may be adjusted by controlling input to the D flip-flop 313.

The second multiplexer 322 outputs the CRC pattern CRCP in the access mode, outputs the EDC hold pattern EDCHP in the CDR function mode and provides an output of the replica delay 330 in a first strobe mode or a second strobe mode in response to first and second strobe mode signals SMS1/SMS2. For example, the second multiplexer 322 provides the output of the replica delay 330 in the first strobe mode or the second strobe mode.

The first transmitter 323 may transmit an output of the second multiplexer 322 to the memory controller 100 through a pad 326. The first transmitter 323 transmits the EDC hold pattern EDCHP to the memory controller in the CDR function mode, the CRC pattern CRCP to the memory controller in the access mode, and transmits the strobe signal RDQS to the memory controller 100 in the first strobe mode or the second strobe mode.

The replica delay 330 may adjust phases of two frequency-divided data clock signals of the frequency-divided data clock signals WCK0, WCK90, WCK180, and WCK270, for example, the first and third frequency-divided data clock signals WCK0 and WCK180 which have a phase difference of 180 degrees with respect to each other, may provide one of the first and third frequency-divided data clock signals WCK0 and WCK180 to the second multiplexer 322 and may provide the other of the first and third frequency-divided data clock signals WCK0 and WCK180 to the third multiplexer 341.

The third multiplexer 341 outputs the data inversion bit signal DBI in the access mode and outputs the output of the replica delay 330 in the second strobe mode in response to the second strobe mode signal SMS2.

The second transmitter 343 may transmit an output of the third multiplexer 341 to the memory controller 100 through a pad 346. The second transmitter 343 transmits the data inversion bit signal DBI to the memory controller in the access mode, and transmits the complementary strobe signal RDQSB to the memory controller 100 in the second strobe mode.

The first sampler 351 provides data DQs (i.e., read data) from the I/O data buffer 270 to the data transmitter 353 in synchronization with one of the frequency-divided data clock signals WCK0, WCK90, WCK180, and WCK270 in the read operation and the data transmitter 353 may transmit data DQs to the memory controller 100 through a pad 356 (e.g., DQ pad).

The data receiver 270 receives data DQs (i.e., write data) from the memory controller 100 and provides the write data DQs to the second sampler 361 through the pad 356 and the data receiver 363, and the second sampler 361 provides the write data DQs to the I/O data buffer 270 in synchronization with one of the frequency-divided data clock signals WCK0, WCK90, WCK180, and WCK270, in the write operation.

Each of the first sampler 351 and the second sampler 361 may include a D flip-flop.

In FIG. 5, the first and second strobe mode signals SMS1 and SMS2 may be included in the strobe mode signal SMS in FIG. 3 and the data inversion bit signal DBI may be provided from a data inversion circuit (not illustrated) in FIG. 3. The data inversion circuit may determine to invert predetermined size of bits of the data DQs and may output the data inversion bit signal DBI indicating whether the predetermined size of bits are inverted or not. In addition, the CRC pattern CRCP may be provided from the EDC pattern generator 280 in FIG. 3.

In example embodiments, the differential strobe signal RDQS/RDQSB may be transmitted through a first pad and a second pad among the plurality of pads of the semiconductor memory device 200 which are not dedicated to the CRCP pad (e.g., pad 326) or the DBI pad (e.g., pad 346).

Figure 6:
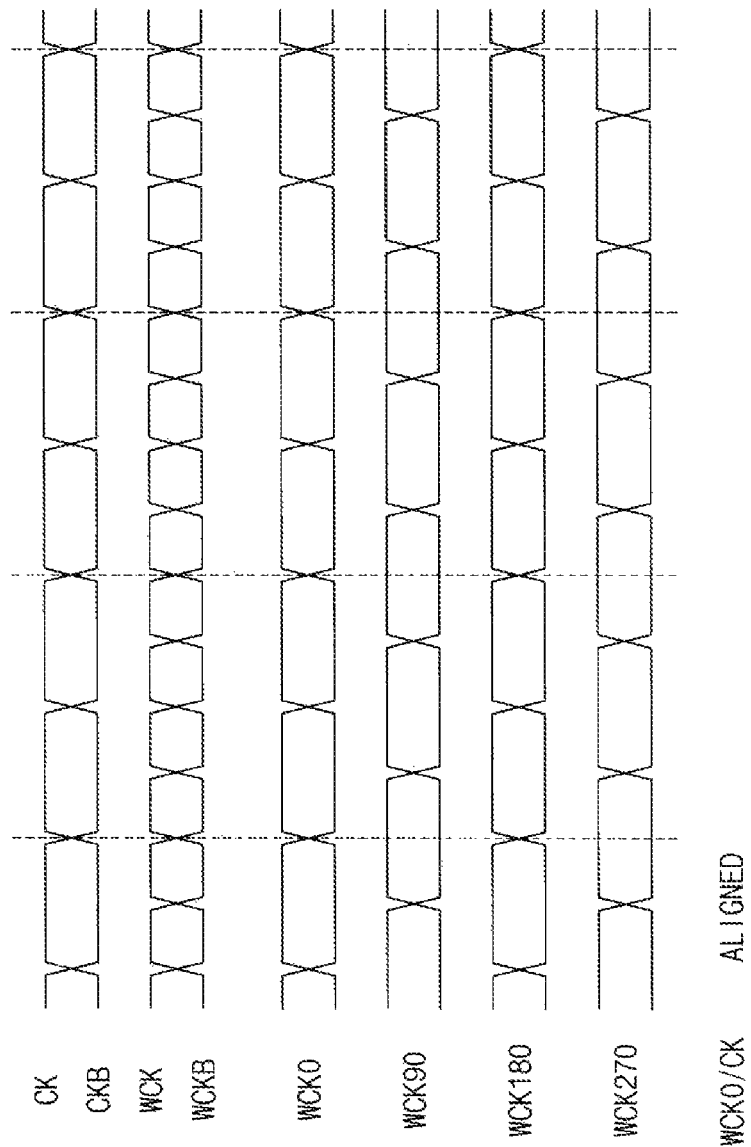
FIG. 6 illustrates that the first frequency-divided data clock signal is automatically synchronized with the clock signal in the I/O circuit of FIG. 5.

FIG. 6 illustrates that the first frequency-divided data clock signal is automatically synchronized with the clock signal in the I/O circuit of FIG. 5.

Referring to FIG. 6, it is noted that the phase splitter 310 synchronizes the first frequency-divided data clock signal WCK0 with the clock signal CK. For synchronizing the first frequency-divided data clock signal WCK0 with the clock signal CK, the phase splitter 310 may swap the first and the second frequency-divided data clock signals WCK0 and WCK 90 with the third and fourth frequency-divided data clock signals WCK180 and WCK270. The swap and synchronization operation is performed in the semiconductor memory device 200 and may be hidden operation to the memory controller 100.

Figure 7:
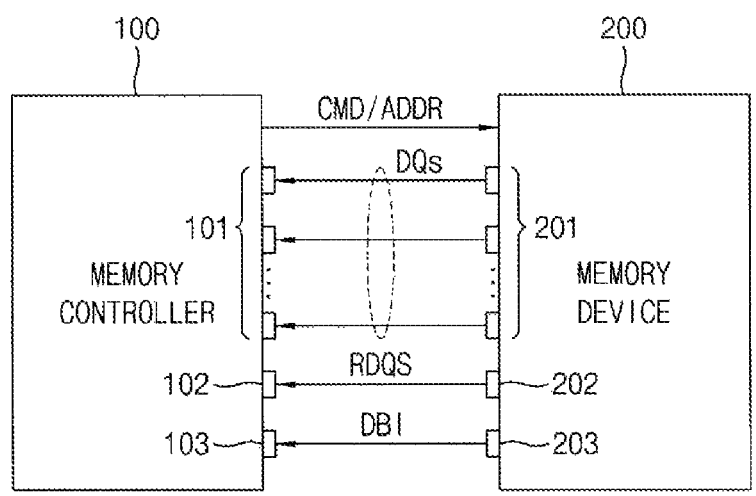
FIG. 7 illustrates an interface of the memory system of FIG. 1 in the first strobe mode.
Figure 8:
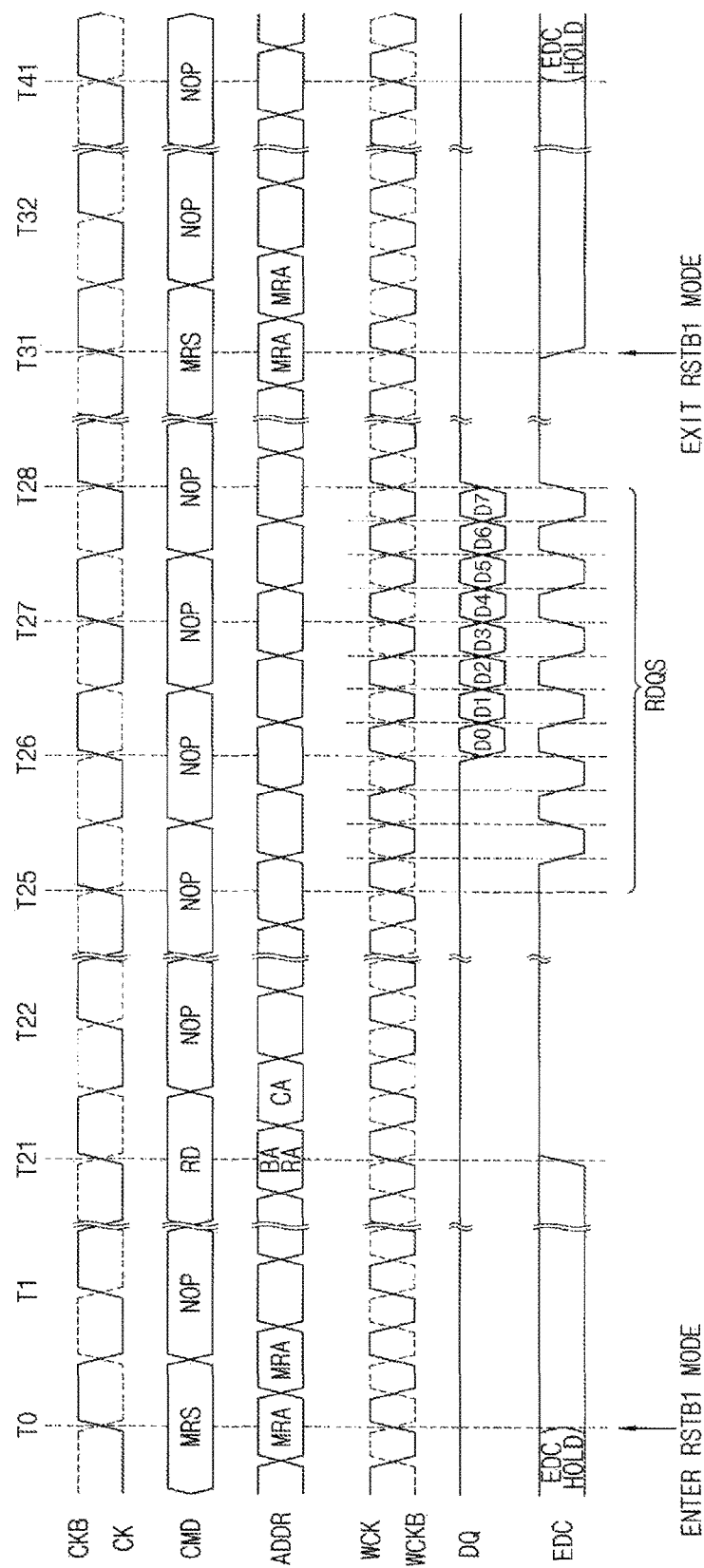
FIG. 8 illustrates operations of the semiconductor memory device of FIG. 3 in the first strobe mode.

FIG. 7 illustrates an interface of the memory system of FIG. 1 in the first strobe mode and FIG. 8 illustrates operation of the semiconductor memory device of FIG. 3 in the first strobe mode.

Referring to FIG. 7, the memory controller 100 includes a plurality of pins 101, 102 and 103 and the semiconductor memory device 200 includes a plurality of pins 201, 202 and 203.

The pins 101 and 201 may be data pins used to transfer data DQs between the memory controller 100 and the semiconductor memory device 200. Each of the pins 102 and 202 may be a first pin used to transfer the RDQS signal from the semiconductor memory device 200 to the memory controller 100. In other embodiments, each of the pins 102 and 202 may be an EDC pin used to transfer the RDQS signal from the semiconductor memory device 200 to the memory controller 100. Each of the pins 103 and 203 may be a DBI pin used to transfer the DBI signal from the semiconductor memory device 200 to the memory controller 100. The plurality of pins 101, 102 and 103 of the memory controller 100 and the plurality of pins 201, 202 and 203 of the semiconductor memory device 200 may be electrically connected to each other. The plurality of pins 201, 202 and 203 of the semiconductor memory device 200 also are electrically connected to the plurality of signal chip pads arranged in a substrate of the semiconductor memory device 200, respectively.

Referring to FIGS. 1, 3, 7 and 8, at a timing T0, the memory controller 100 sets the mode register 222 using the command CMD and the address ADDR such that the semiconductor memory device 200 operates in a first strobe mode RSTB1. At a timing T21, a read command RD and the addresses BA, RA and CA are applied to the semiconductor memory device 200.

From a timing T25 to a timing T28, the semiconductor memory device 200 transmits, to the memory controller 100, the EDC pattern which is toggling as the single strobe signal RDQS through the EDC pins 202 and 102. From a timing T26 to a timing T28, the semiconductor memory device 200 transmits, to the memory controller 100, the data DQs, i.e., D0~D7 from the data pins 201 (or, DQ pins) of the semiconductor memory device 200 to the data pins 101 (or, DQ pins) of the memory controller 100. The memory controller 100 may sample the data DQs based on the single strobe signal RDQS.

At a timing T31, the memory controller 100 sets the mode register 222 using the command CMD and the address ADDR such that the semiconductor memory device 200 exits from the first strobe mode RSTB1.

From the timing T0 to a timing T41, the differential clock signal CK/CKB and the differential data clock signal WCK/WCKB are transmitted from the memory controller 100 to the semiconductor memory device 200.

In FIG. 8, it is illustrated that the frequency of the single strobe signal RDQS is two times higher than the frequency of the differential clock signal CK/CKB. In exemplary embodiments, the frequency of the single strobe signal RDQS may be same as the frequency of the differential clock signal CK/CKB or may be four times higher than the frequency of the differential clock signal CK/CKB.

In other exemplary embodiments, the frequency of the single strobe signal RDQS may be the same as, a half or a quarter of the frequency of the differential data clock signal WCK/WCKB. In this case, the memory controller 100 can measure a jitter characteristic of read data received from the semiconductor memory device 200 before the semiconductor memory device 200 operates in the access mode. Also, the power consumption of the semiconductor memory device 200 may be reduced when using the frequency of the single strobe signal RDQS that is a half or a quarter of the frequency of the differential data clock signal WCK/WCKB.

Figure 9:
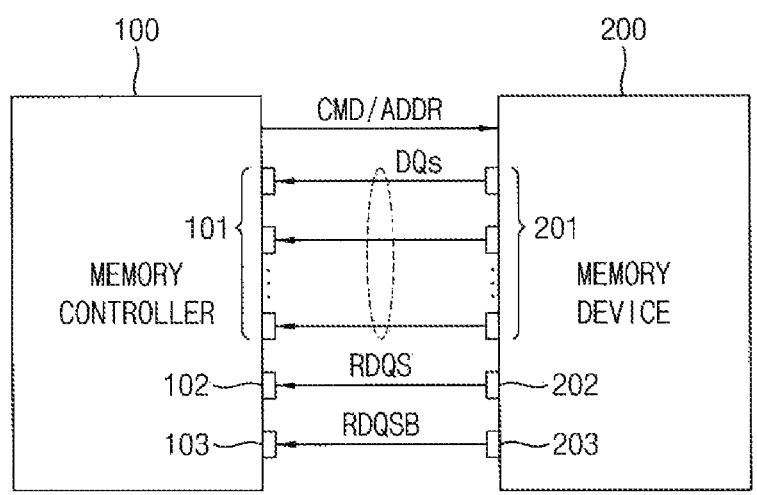
FIG. 9 illustrates an interface of the memory system of FIG. 1 in the second strobe mode.
Figure 10:
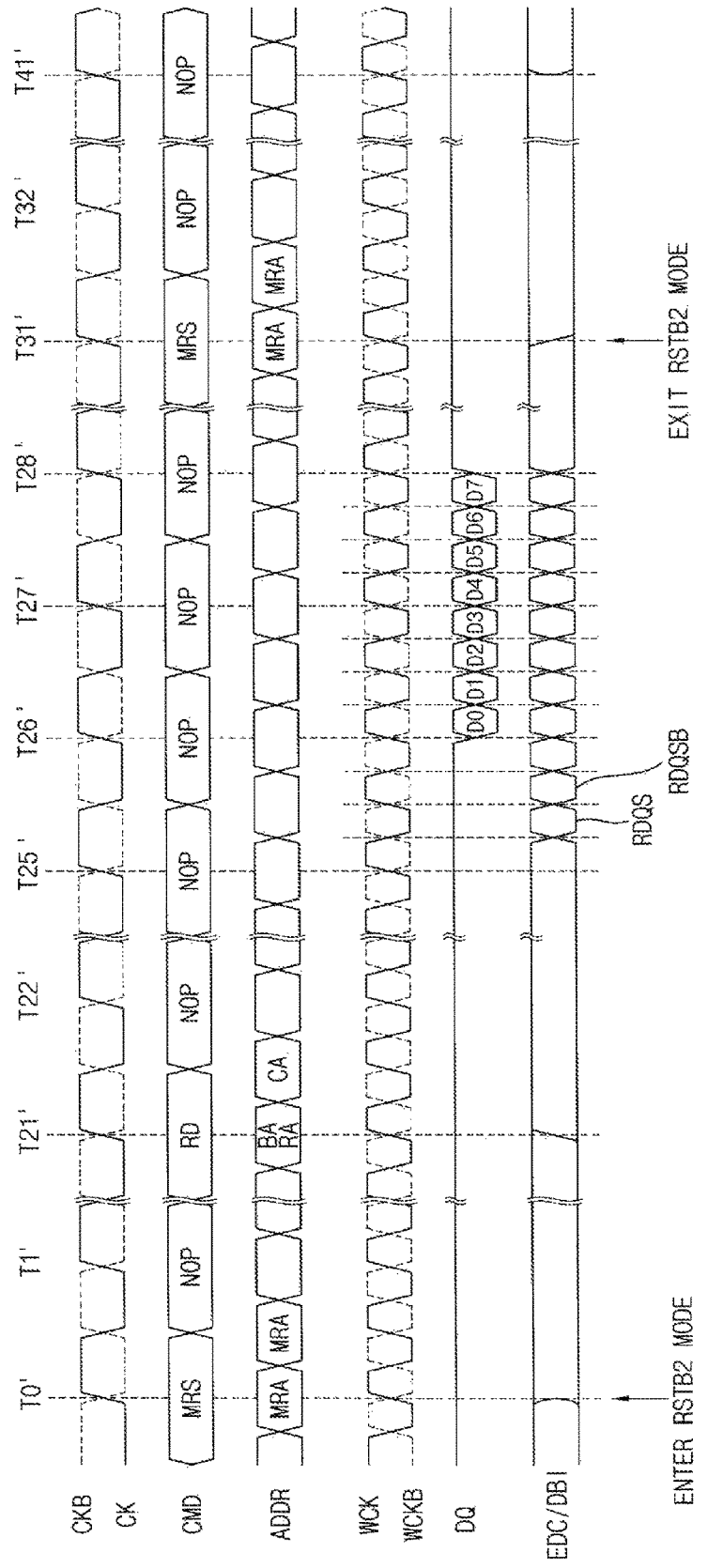
FIG. 10 illustrates operations of the semiconductor memory device of FIG. 3 in the second strobe mode.

FIG. 9 illustrates an interface of the memory system of FIG. 1 in the second strobe mode and FIG. 10 illustrates operations of the semiconductor memory device of FIG. 3 in the second strobe mode.

Referring to FIG. 9, the memory controller 100 includes a plurality of pins 101, 102 and 103 and the semiconductor memory device 200 includes a plurality of pins 201, 202 and 203.

The pins 101 and 201 may be data pins used to transfer data DQs between the memory controller 100 and the semiconductor memory device 200. Each of the pins 102 and 202 may be a first pin used to transfer the RDQS signal from the semiconductor memory device 200 to the memory controller 100. In other embodiments, each of the pins 102 and 202 may be an EDC pin used to transfer the RDQS signal from the semiconductor memory device 200 to the memory controller 100. Each of the pins 103 and 203 may be a second pin used to transfer the RDQSB signal from the semiconductor memory device 200 to the memory controller 100. In other embodiments, each of the pins 103 and 203 may be a DBI pin used to transfer the RDQSB signal from the semiconductor memory device 200 to the memory controller 100. The plurality of pins 201, 202 and 203 of the semiconductor memory device 200 also are electrically connected to the plurality of signal chip pads arranged in a substrate of the semiconductor memory device 200, respectively.

Referring to FIGS. 1, 3, 9 and 10, at a timing T0', the memory controller 100 sets the mode register 222 using the command CMD and the address ADDR such that the semiconductor memory device 200 operates in a second strobe mode RSTB2. At a timing T21', the read command RD and the addresses BA, RA and CA are applied to the semiconductor memory device 200.

From a timing T25' to a timing T28', the semiconductor memory device 200 transmits, to the memory controller 100, a first output of the replica delay 330 as the strobe signal RDQS through EDC pins 202 and 102 and a second output of the replica delay 330 as the complementary strobe signal RDQSB through DBI pins 203 and 103. From a timing T26' to a timing T28', the semiconductor memory device 200 transmits, to the memory controller 100, the data DQs, i.e., D0~D7 from data pins 201 (or, DQ pins) of the semiconductor memory device 200 to data pins 101 (or, DQ pins) of the memory controller 100. The memory controller 100 may sample the data DQs based on the differential strobe signal RDQS/RDQSB.

At a timing T31', the memory controller 100 sets the mode register 222 using the command CMD and the address ADDR such that the semiconductor memory device 200 exits from the second strobe mode RSTB2.

From the timing T0' to a timing T41', the differential clock signal CK/CKB and the differential data clock signal WCK/WCKB are transmitted from the memory controller 100 to the semiconductor memory device 200.

In other exemplary embodiments, the frequency of the differential strobe signal RDQS/RDQSB may be a half or a quarter of the frequency of the differential data clock signal WCK/WCKB. In this case, the memory controller 100 may detect a quality of read data from the semiconductor memory device 200 before the semiconductor memory device 200 operates in the access mode. Also, a power consumption of the semiconductor memory device 200 may be reduced.

In one embodiment, the memory controller 100 sets the mode register 222 using the command CMD such that the semiconductor memory device 200 may operate one of the CDR function mode, the access mode, a first strobe mode RSTB1 and a second strobe mode RSTB2. In other embodiments, the memory controller 100 may provide command CMD to the command decoder 221 such that the semiconductor memory device 200 may operate one of the CDR function mode, the access mode, the first strobe mode RSTB1 and the second strobe mode RSTB2.

For example, when the semiconductor memory device 200 operates in the CDR function mode, the mode register 222 may output "00" and the semiconductor memory device 200 may transfer the EDC hold pattern EDCHP to the memory controller 100 through the pin 202 (e.g., EDC pin). When the semiconductor memory device 200 operates in the access mode, the mode register 222 may output "01" and the semiconductor memory device 200 may transfer the CRC pattern CRCP to the memory controller 100 through the pin 202 (e.g., EDC pin) and transfer the data inversion bit signal DBI to the memory controller 100 through the pin 203 (e.g., DBI pin). When the semiconductor memory device 200 operates in the first strobe mode RSTB1, the mode register 222 may output "10" and the semiconductor memory device 200 may transfer the strobe signal RDQS through the pin 202 (e.g., a first pin or the EDC pin) and transfer the data inversion bit signal DBI through the pin 203 (e.g., DBI pin). When the semiconductor memory device 200 operates in the second strobe mode RSTB2, the mode register 222 may output "11" and the semiconductor memory device 200 may transfer the strobe signal RDQS to the memory controller 100 through the pin 202 (e.g., the first pin or EDC pin) and transfer the inverted strobe signal RDQSB through the pin 203 (e.g., a second pin or the DBI pin).

Figure 11:
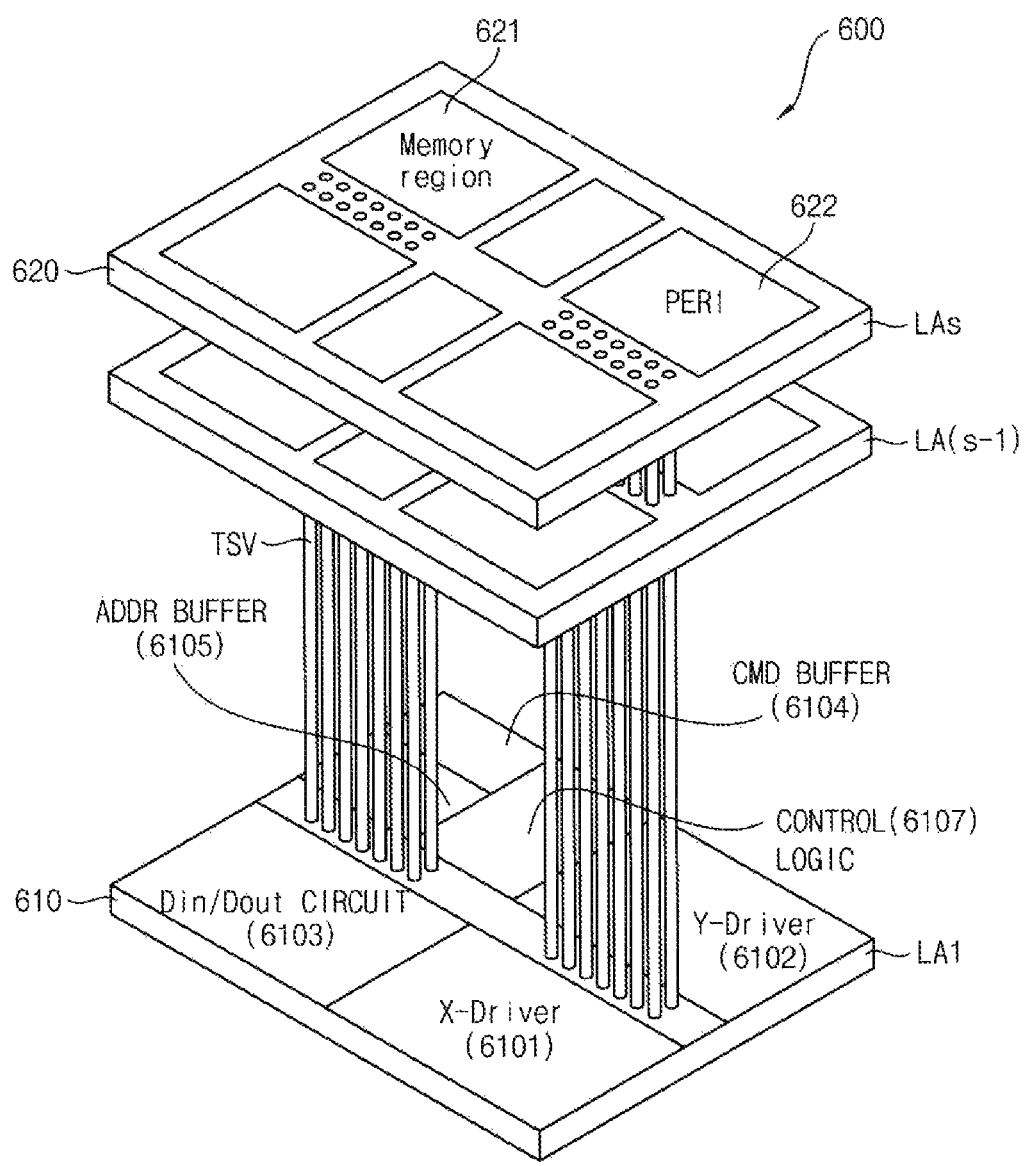
FIG. 11 is a structural diagram illustrating a semiconductor memory device according to exemplary embodiments.

FIG. 11 is a structural diagram illustrating a semiconductor memory device according to exemplary embodiments.

Referring to FIG. 11, a semiconductor memory device 600 may include first through sth (s is a natural number greater than two) semiconductor integrated circuit layers LA1 through LAs, in which the lowest first semiconductor integrated circuit layer LA1 is assumed to be an interface or a control chip and the other semiconductor integrated circuit layers LA2 through LAs are assumed to be slave chips including core memory chips. The first through nth semiconductor integrated circuit layers LA1 through LAs may transmit and receive signals therebetween through through-sub strate-vias (TSVs). The lowest first semiconductor integrated circuit layer LA1 as the interface or the control chip may communicate with an external memory controller through a conductive structure formed on an external surface. A description will be made regarding structure and an operation of the semiconductor memory device 600 by mainly using the first semiconductor integrated circuit layer LA1 or 610 as the interface or control chip and the nth semiconductor integrated circuit layer LAs or 620 as the slave chip.

The first semiconductor integrated circuit layer 610 may include various peripheral circuits for driving a memory region 621 provided in the sth semiconductor integrated circuit layer 620. For example, the first semiconductor integrated circuit layer 610 may include a row (X)-driver 6101 for driving word-lines of the memory region 610, a column (Y)-driver 6102 for driving bit lines of the memory region 610, a data I/O circuit (Din/Dout) 6103 for controlling input/output of data, a command buffer (CMD) 6104 for receiving a command CMD from outside and buffering the command CMD, and an address buffer (ADDR) 6105 for receiving an address from outside and buffering the address. The memory region 621 may include a plurality of memory cells described with reference to FIG. 4.

The first semiconductor integrated circuit layer 610 may further include a control logic 6107. The control logic 6107 may control an access to the memory region 621 based on a command and an address signal received from a memory controller.

The sth semiconductor integrated circuit layer 620 may include the memory region 621 and peripheral circuit regions 622 in which peripheral circuits for reading/writing data of the memory region 621, e.g., a row decoder, a column decoder, a bit line sense amplifier, etc. (not illustrated) are arranged.

The data I/O circuit 6103 may employ the I/O circuit 300 of FIG. 5. Therefore, the semiconductor memory device 600 uses the differential data clock signal WCK/WCKB in the write operation, and transmits the single strobe signal RDQS or the differential strobe signal RDQS/RDQSB to the memory controller in a read operation thereby to enhance a jitter characteristic as described with reference to FIGS. 2 through 10.

In addition, a three dimensional (3D) memory array is provided in semiconductor memory device 600. The 3D memory array is monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array. The following patent documents, which are hereby incorporated by reference, describe suitable configurations for the 3D memory arrays, in which the three-dimensional memory array is configured as a plurality of levels, with word-lines and/or bit-lines shared between levels: U.S. Pat. Nos. 7,679,133; 8,553,466; 8,654,587; 8,559,235; and US Pat. Pub. No. 2011/0233648.

Figure 12:
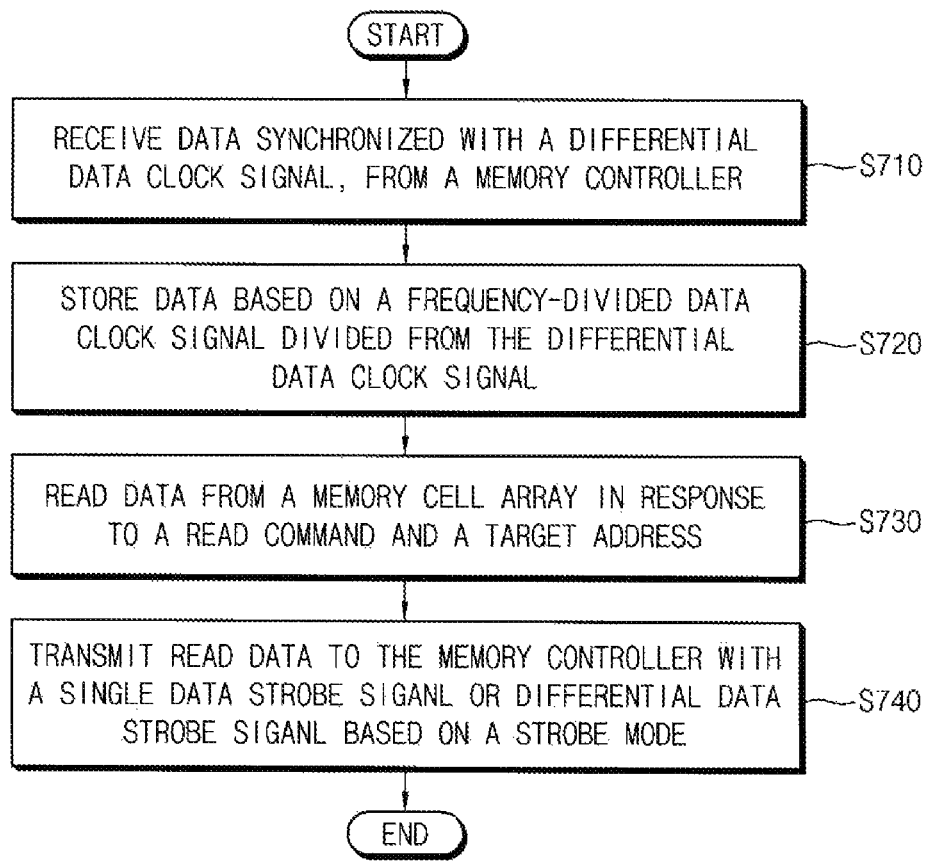
FIG. 12 is a flow chart illustrating a method of operating a semiconductor memory device according to exemplary embodiments.

FIG. 12 is a flow chart illustrating a method of operating a semiconductor memory device according to exemplary embodiments.

Referring to FIGS. 1 through 12, in a method of operating a semiconductor memory device 200 including a memory cell array and a control logic circuit that controls access to the memory cell array, the semiconductor memory device 100 may receive data DQs synchronized with a differential data clock signal WCK/WCKB from a memory controller 100 (S710). The semiconductor memory device 100 may store the data in the memory cell array based on a frequency-divided data clock signal from which the differential data clock signal WCK/WCKB is divided (S720).

The semiconductor memory device 200 reads data from the memory cell array in response to a read command RD and a target address ADDR received from the memory controller 100 (S730). The semiconductor memory device 200 transmits the read data to the memory controller 100 with one of a single strobe signal RDQS and a differential strobe signal RDQS/RDQSB according to a strobe mode (S740). The differential strobe signal RDQS/RDQSB is generated based on the frequency-divided data clock signal.

The semiconductor memory device 200 may transmits the single strobe signal RDQS to the memory controller 100 via an EDC pin 202 of the semiconductor memory device 200 in a first strobe mode. The semiconductor memory device 200 may transmit the differential strobe signals RDQS/RDQSB to the memory controller 100 via the EDC pin 202 (or, a first pin other than the EDC pin) and a DBI pin 203 (or, a second pin other than the DBI pin) of the semiconductor memory device 200 in a second strobe mode.

Figure 13:
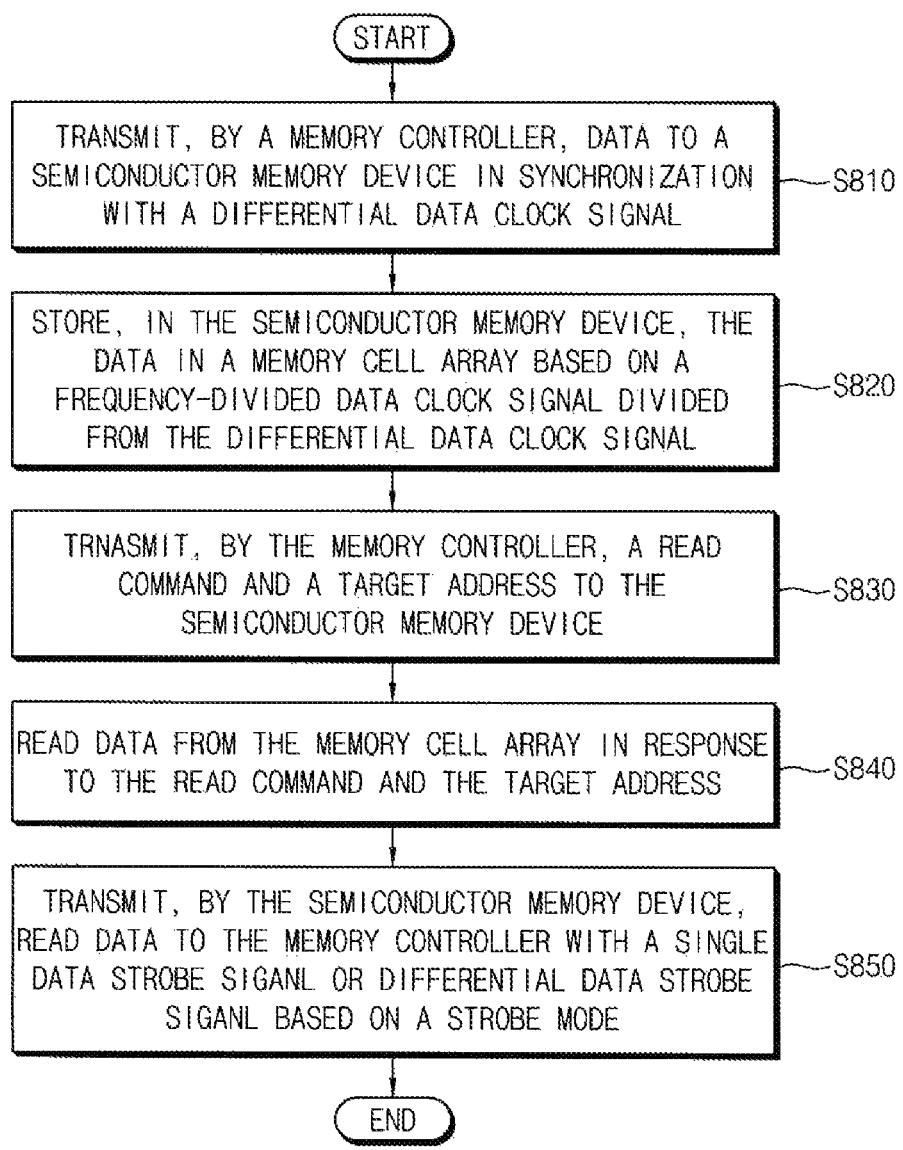
FIG. 13 is a flow chart illustrating a method of operating a memory system according to exemplary embodiments.

FIG. 13 is a flow chart illustrating a method of operating a memory system according to exemplary embodiments.

Referring to FIGS. 1 through 10 and 13, in a method of operating a memory system 10 including a semiconductor memory device 200 and a memory controller 100 that controls the semiconductor memory device 100, the memory controller 100 may transmit data DQs to the semiconductor memory device 200 in synchronization with a differential data clock signal WCK/WCKB (S810). The semiconductor memory device 200 may store the data DQs in a target area, designated by the address ADDR, of the memory cell array based on a frequency-divided data clock signal divided from the differential data clock signal WCK/WCKB (S820).

The memory controller 100 transmits a read command RD and a target address ADDR to the semiconductor memory device 200 (S830). The semiconductor memory device 200 reads data DTA from a memory region designated by the target address ADDR (S840). The semiconductor memory device 200 transmits the read data DQs to the memory controller 100 with one of a single strobe signal RDQS and a differential strobe signal RDQS/RDQSB in response to a strobe mode signal SMS in a strobe mode (S850).

Figure 14:
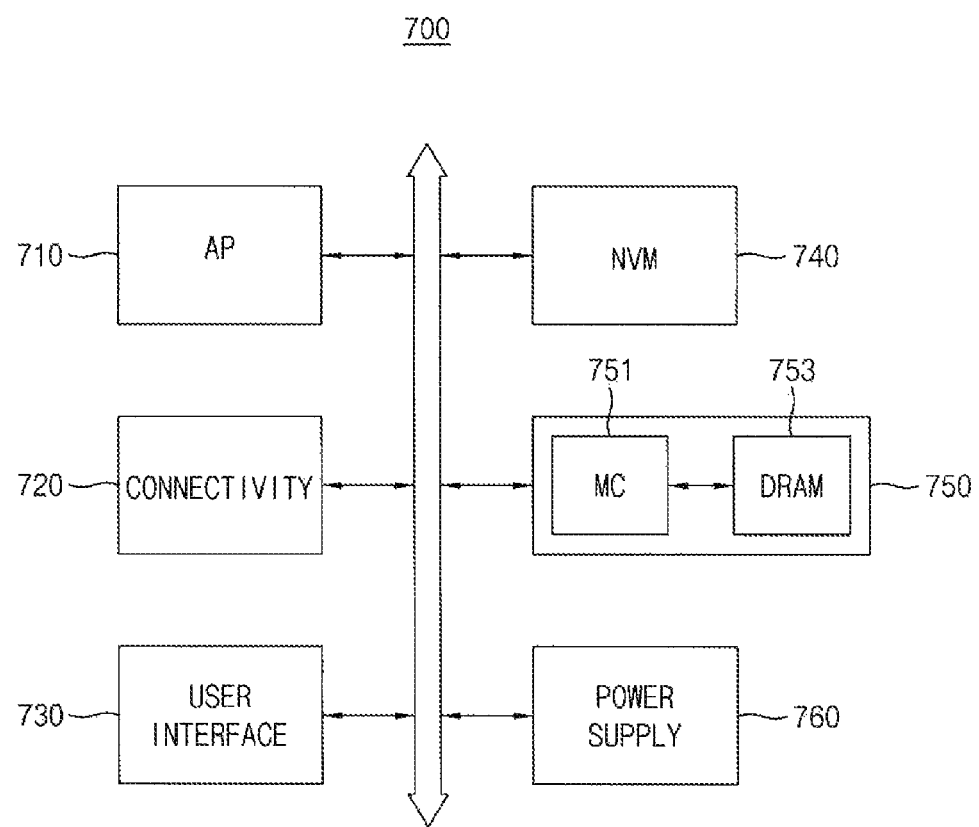
FIG. 14 is a block diagram illustrating a mobile system including the semiconductor memory device according to exemplary embodiments.

FIG. 14 is a block diagram illustrating a mobile system including the semiconductor memory device according to exemplary embodiments.

Referring to FIG. 14, a mobile system 700 may include an application processor 710, a connectivity unit 720, a user interface 730, a nonvolatile memory device 740, a memory sub system 750 and a power supply 760. The memory sub system 750 may include a memory controller 751 and a semiconductor memory device 753 such as DRAM.

The application processor 710 may execute applications, such as a web browser, a game application, a video player, etc. The connectivity unit 720 may perform wired or wireless communication with an external device.

The memory sub system 750 may store data processed by the application processor 710 or operate as a working memory. The semiconductor memory device 753 may employ the semiconductor memory device 200 of FIG. 3. Therefore, semiconductor memory device 753 uses the differential data clock signal in a write operation, and transmits the single strobe signal or the differential strobe signal to the memory controller 751 in a read operation thereby to enhance a jitter characteristic The nonvolatile memory device 740 may store a boot image for booting the mobile system 700. The user interface 730 may include at least one input device, such as a keypad, a touch screen, etc., and at least one output device, such as a speaker, a display device, etc. The power supply 760 may supply a power supply voltage to the mobile system 700.

In some embodiments, the mobile system 700 and/or components of the mobile device 700 may be packaged in various forms.

Accordingly, a semiconductor memory device and a memory system using WCK clocking support a strobe mode in which a single strobe signal or a differential strobe signal is used, and jitter characteristic of the semiconductor memory device may be enhanced.

The present disclosure may be applied to systems using LPDDR5 SDRAM. The present disclosure may be applied to systems such as be a mobile phone, a smart phone, a personal digital assistant (PDA), a portable multimedia player (PMP), a digital camera, a camcorder, personal computer (PC), a server computer, a workstation, a laptop computer, a digital TV, a set-top box, a portable game console, a navigation system, etc.

The foregoing is illustrative of exemplary embodiments and is not to be construed as limiting thereof. Although a few exemplary embodiments have been described, those skilled in the art will readily appreciate that many modifications are possible in the exemplary embodiments without materially departing from the novel teachings and advantages of the present disclosure. Accordingly, all such modifications are intended to be included within the scope of the present disclosure as defined in the claims.

What is claimed is:

1. A method of operating a semiconductor memory device including a plurality of pins configured to transfer data and signals from/to an outside of the semiconductor memory device, a memory cell array and a control logic circuit configured to control access to the memory cell array, the method comprising:

receiving data from an external memory controller, the data being synchronized with a differential data clock signal;

storing the data in the memory cell array based on a frequency-divided data clock signal from which the differential data clock signal is divided;

reading data from the memory cell array in response to a read command and a target address from the memory controller; and transmitting the read data to the memory controller with a selected one of a first strobe signal generated based on the frequency-divided data clock signal and a differential strobe signal generated based on the frequency-divided data clock signal, wherein the differential strobe signal includes the first strobe signal and a second strobe signal which is the first strobe signal inverted, and wherein the semiconductor memory device does not include a dedicated strobe pin among the plurality of pins.

2. The method of claim 1, wherein a frequency of the frequency-divided data clock signal is a half of a frequency of the differential data clock signal.

3. The method of claim 1, wherein the transmitting the read data to the memory controller with a selected one of a first strobe signal and a differential strobe signal, includes:

transmitting the read data to the memory controller with the first strobe signal in a first strobe mode of the semiconductor memory device, and transmitting the read data to the memory controller with the differential strobe signal in a second strobe mode of the semiconductor memory device.

4. The method of claim 3, wherein the differential strobe signal is in synchronization with the differential data clock signal.

5. The method of claim 3, further comprising:

selecting one of the first and second strobe modes by a mode register of the semiconductor memory device, the mode register configured to select between the first and second strobe modes.

6. The method of claim 3, further comprising:

selecting one of the first and second strobe modes by a command decoder of the semiconductor memory device based on a command received from the memory controller, the command decoder configured to select between the first and second strobe modes.

7. The method of claim 3, further comprising:

transmitting an error detection code pattern and a data inversion bit signal to the memory controller through first and second pins of the plurality of pins, respectively, in a first mode of the semiconductor memory device, wherein in the transmitting the read data to the memory controller with the first strobe signal in the first strobe mode of the semiconductor memory device, transmitting the first strobe signal is performed through a third pin, and wherein in the transmitting the read data to the memory controller with the differential strobe signal in the second strobe mode of the semiconductor memory device, transmitting the first and second strobe signals of the differential strobe signal is performed through the third and a fourth pins of the plurality of pins, respectively.

8. The method of claim 3, further comprising:

transmitting an error detection code pattern and a data inversion bit signal to the memory controller through first and second pins of the plurality of pins, respectively, in a first mode of the semiconductor memory device, wherein in the transmitting the read data to the memory controller with the first strobe signal in the first strobe mode of the semiconductor memory device, transmitting the first strobe signal is performed through the first pin, and wherein in the transmitting the read data to the memory controller with the differential strobe signal in the second strobe mode of the semiconductor memory device, transmitting the first and second strobe signals of the differential strobe signal is performed through the first and second pins of the plurality of pins, respectively.

9. The method of claim 8, further comprising:

transmitting the data inversion bit signal to the memory controller through the second pin in the first strobe mode.

10. The method of claim 9, wherein a frequency of the first strobe signal is the same as, a half, or a quarter of a frequency of the differential data clock signal.

11. A semiconductor memory device comprising:

a plurality of pads disposed on a substrate;

a memory cell array configured to store data which is synchronized with a differential data clock signal received from an external memory controller in a write operation of the semiconductor memory device;

a control logic circuit configured to control access on the memory cell array in response to a command and address received from the memory controller; and an input/output (I/O) circuit configured to transmit read data from the memory cell array to the memory controller with a selected one of a first strobe signal generated based on a frequency-divided data clock signal from which the differential data clock signal is divided and a differential strobe signal generated based on the frequency-divided data clock signal and having the first strobe signal and a second strobe signal which is the first strobe signal inverted, wherein the control logic circuit is configured to select between the first strobe signal and the differential strobe signal, and wherein the semiconductor memory device does not include a dedicated strobe pad among the plurality of pads.

12. The semiconductor memory device of claim 11, wherein the control logic circuit is configured to generate an internal command and a strobe mode signal designating a strobe mode to one of a first strobe mode and a second strobe mode, in response to the command and the address.

13. The semiconductor memory device of claim 12, wherein the I/O circuit is configured to transmit the read data to the memory controller with the first strobe signal when the strobe mode signal designates the first strobe mode, and wherein a frequency of the first strobe signal is the same as, a half, or a quarter of a frequency of the differential data clock signal.

14. The semiconductor memory device of claim 12, wherein the I/O circuit is configured to transmit the read data to the memory controller with the differential strobe signal when the strobe mode signal designates the second strobe mode, wherein the first strobe signal is transmitted to the memory controller through a first pin through which an error detection code pattern of the semiconductor memory device is transmitted, and wherein the second strobe signal is transmitted to the memory controller through a second pin through which a data inversion bit of the semiconductor memory device is transmitted.

15. The semiconductor memory device of claim 11, wherein the memory cell array is a three-dimensional memory cell array including a plurality of dynamic memory cells, and wherein the I/O circuit comprises:

a phase splitter configured to divide a frequency of the differential data clock signal to generate a plurality of frequency-divided data clock signals;

a D flip-flop configured to output one of the frequency-divided data clock signals as an error detection code hold pattern in synchronization with a differential clock signal provided from the memory controller;

a first multiplexer configured to output one of a cyclic redundancy check pattern and the error detection code hold pattern in response to a clock data recovery function mode signal;

a replica delay configured to adjust phases of first and second frequency-divided data clock signals of the frequency-divided data clock signals, wherein the first and second frequency-divided data clock signals have a phase difference of 180 degrees with respect to each other;

a second multiplexer configured to output one of an output of the first multiplexer and the phase-adjusted first frequency-divided data clock signal in response to first and second strobe mode signals; and a third multiplexer configured to output one of phase-adjusted second frequency-divided data clock signal and a data inversion bit signal in response to the second strobe mode signal.

* * * * *